United States Patent
Roesler et al.

(10) Patent No.: US 11,522,516 B2
(45) Date of Patent: Dec. 6, 2022

(54) THIN-FILM SURFACE-ACOUSTIC-WAVE FILTER USING LITHIUM NIOBATE

(71) Applicant: RF360 EUROPE GMBH, Munich (DE)

(72) Inventors: Ulrike Monika Roesler, Hebertshausen (DE); Ingo Bleyl, Munich (DE)

(73) Assignee: RF360 EUROPE GMBH, Munich (DE)

(*) Notice: Subject to any disclaimer, the term of this patent is extended or adjusted under 35 U.S.C. 154(b) by 111 days.

(21) Appl. No.: 17/005,208

(22) Filed: Aug. 27, 2020

(65) Prior Publication Data

US 2022/0069804 A1 Mar. 3, 2022

(51) Int. Cl.
*H03H 9/02* (2006.01)
*H03H 9/64* (2006.01)
*H03H 9/145* (2006.01)

(52) U.S. Cl.
CPC .... *H03H 9/02559* (2013.01); *H03H 9/02818* (2013.01); *H03H 9/02834* (2013.01); *H03H 9/145* (2013.01); *H03H 9/6489* (2013.01)

(58) Field of Classification Search
CPC ............. H03H 9/6489; H03H 9/02559; H03H 9/02818; H03H 9/02834; H03H 9/145
USPC ........................ 333/133, 193–196
See application file for complete search history.

(56) References Cited

U.S. PATENT DOCUMENTS

| | | | |
|---|---|---|---|
| 7,446,453 B1 | 11/2008 | Naumenko et al. | |
| 2006/0109064 A1* | 5/2006 | Toncich | H03H 9/76 333/195 |
| 2019/0068161 A1 | 2/2019 | Kimura | |
| 2020/0020520 A1 | 1/2020 | Reynaud et al. | |

(Continued)

FOREIGN PATENT DOCUMENTS

WO   2018075682 A1   4/2018

OTHER PUBLICATIONS

Kimura, et al., "3.5 GHz Longitudinal Leaky Surface Acoustic Wave Resonator Using a Multilayered Waveguide Structure for High Acoustic Energy Confinement", Japanese Journal of Applied Physics 57, 07LD15 (2018); Retrieved from https://doi.org/10.7567/JJAP.57.07LD15, Jun. 11, 2018, 5 pages.

(Continued)

*Primary Examiner* — Samuel S Outten
*Assistant Examiner* — Jorge L Salazar, Jr.
(74) *Attorney, Agent, or Firm* — Colby Nipper; Qualcomm Incorporated

(57) ABSTRACT

An apparatus is disclosed for a surface-acoustic-wave filter using lithium niobate ($LiNbO_3$). In an example aspect, the apparatus includes at least one surface-acoustic-wave filter including an electrode structure, a substrate layer, and a piezoelectric layer disposed between the electrode structure and the substrate layer. The piezoelectric layer includes lithium niobate material configured to enable propagation of an acoustic wave across its planar surface in a direction along a first filter axis. A second filter axis is along the planar surface and perpendicular to the first filter axis. A third filter (Continued)

axis is normal to the planar surface. An orientation of the first, second, and third filter axes is relative to a crystalline structure of the lithium niobate material as defined by Euler angles $\lambda$, $\mu$, and $\theta$. A value of $\mu$ has a range approximately from $-70°$ to $-55°$ or at least one symmetrical equivalent.

30 Claims, 8 Drawing Sheets

(56) References Cited

U.S. PATENT DOCUMENTS

2020/0036357 A1    1/2020  Mimura
2020/0228088 A1    7/2020  Broekaart et al.

OTHER PUBLICATIONS

Kimura, et al., "Observation of Longitudinal-type SAWs on a Thin LiNbO3 Plate by Laser Prove System", Proceedings of Symposium on Ultrasonic Electronics, vol. 39 (2018), Oct. 29-31, 2018, Oct. 2018, 2 pages.
Partial International Search Report—PCT/EP2021/072328—ISA/EPO—dated Nov. 18, 2021, 12 pages.
International Search Report and Written Opinion—PCT/EP2021/072328—ISA/EPO—dated Feb. 11, 2022 18 pages.

\* cited by examiner

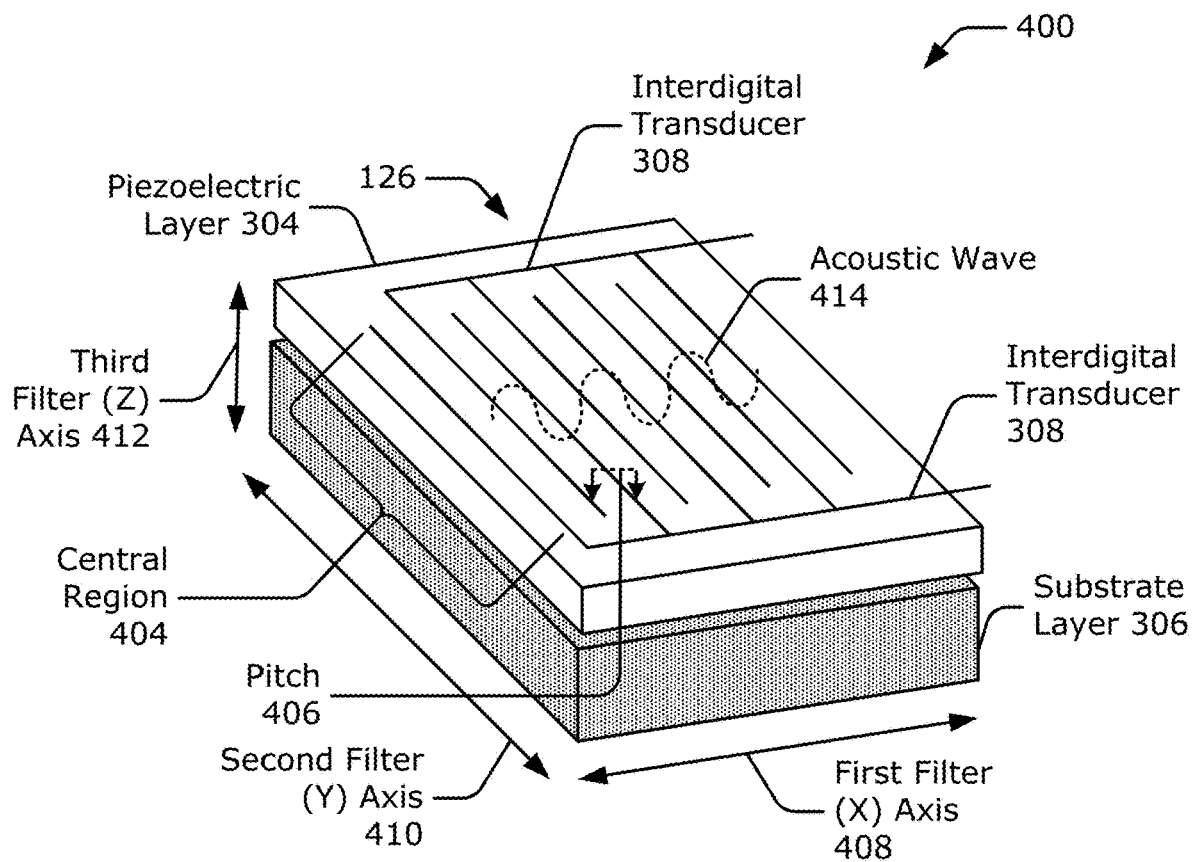
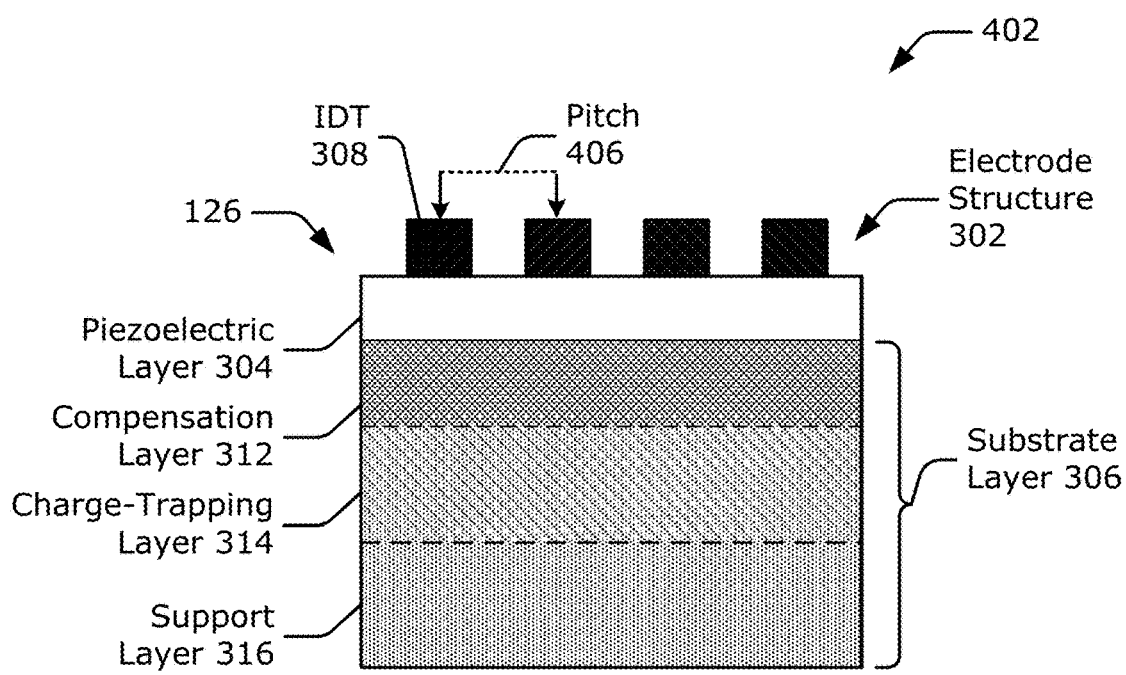
FIG. 4

600

```
┌─────────────────────────────────────┐
│  Convert a radio-frequency signal   │
│  into an acoustic wave using an     │
│  electrode structure of a           │
│  surface-acoustic-wave filter       │
│                 602                 │
└─────────────────────────────────────┘
                  │
                  ▼
┌─────────────────────────────────────┐
│  Propagate the acoustic wave across │
│  a piezoelectric layer of the       │
│  surface-acoustic-wave filter, the  │
│  piezoelectric layer comprising a   │
│  lithium niobate material having a  │
│  planar surface                     │
│                 604                 │
│  ┌───────────────────────────────┐  │
│  │ Propagate the acoustic wave   │  │
│  │ across the planar surface of  │  │
│  │ the lithium niobate material  │  │
│  │ in a direction along a first  │  │
│  │ filter (X) axis               │  │
│  │            606                │  │
│  └───────────────────────────────┘  │
└─────────────────────────────────────┘
                  │
                  ▼
┌─────────────────────────────────────┐
│  Convert the propagated acoustic    │
│  wave into a filtered signal using  │
│  the electrode structure            │
│                 608                 │
└─────────────────────────────────────┘
```

FIG. 6

THIN-FILM SURFACE-ACOUSTIC-WAVE FILTER USING LITHIUM NIOBATE

TECHNICAL FIELD

This disclosure relates generally to wireless transceivers and, more specifically, to a thin-film surface-acoustic-wave (TFSAW) filter with a lithium niobate (LiNbO$_3$) layer.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) other jammers or noise having frequencies outside of the frequency band. As the number of available frequency bands increases and as the desired passband of filters widens, it can be challenging to design a filter that can support wide bandwidths without increasing losses within the passband.

SUMMARY

An apparatus is disclosed that implements a thin-film surface-acoustic-wave (TFSAW) filter using lithium niobate (LiNbO$_3$). In example implementations, the thin-film surface-acoustic-wave filter includes an electrode structure, a substrate layer, and a piezoelectric layer. The piezoelectric layer includes lithium niobate material with a crystal orientation defined by Euler angles lambda ($\lambda$), mu ($\mu$), and theta ($\theta$). In some cases, a value of the Euler angle mu ($\mu$) can be approximately between −70° and −55°, or equivalent angles thereof due to crystal symmetry. Values of the Euler angles lambda ($\lambda$) and theta ($\theta$) can each be approximately between −10° and 10°.

In an example aspect, an apparatus for filtering is disclosed. The apparatus includes at least one surface-acoustic-wave filter. The surface-acoustic-wave filter includes an electrode structure, a substrate layer, and a piezoelectric layer disposed between the electrode structure and the substrate layer. The piezoelectric layer includes lithium niobate (LiNbO$_3$) material having a planar surface. The lithium niobate material is configured to enable propagation of an acoustic wave across the planar surface in a direction along a first filter (X) axis. A second filter (Y) axis is along the planar surface and perpendicular to the first filter (X) axis. A third filter (Z) axis is normal to the planar surface. An orientation of the first filter (X) axis, the second filter (Y) axis, and the third filter (Z) axis is relative to a crystalline structure of the lithium niobate plate as defined by Euler angles lambda ($\lambda$), mu ($\mu$), and theta ($\theta$). A value of the Euler angle mu ($\mu$) has a range approximately from −70° to −55° or at least one symmetrical equivalent.

In an example aspect, an apparatus for filtering is disclosed. The apparatus includes at least one surface-acoustic-wave filter configured to generate a filtered signal from a radio-frequency signal. The surface-acoustic-wave filter includes electrode means for converting the radio-frequency signal into an acoustic wave and converting a propagated acoustic wave into the filtered signal. The surface-acoustic-wave filter additionally includes piezoelectric means for propagating the acoustic wave across a planar surface to produce the propagated acoustic wave. A first filter (X) axis is along the planar surface and a second filter (Y) axis is along the planar surface and perpendicular to the first filter (X) axis. A third filter (Z) axis is normal to the planar surface. An orientation of the first filter (X) axis, the second filter (Y) axis, and the third filter (Z) axis is relative to a crystalline structure of the piezoelectric means as defined by Euler angles lambda ($\mu$), mu ($\mu$), and theta ($\theta$). A value of the Euler angle mu ($\mu$) has a range approximately from −70° to −55° or at least one symmetrical equivalent.

In an example aspect, a method performed by a surface-acoustic-wave filter is disclosed. The method includes converting a radio-frequency signal into an acoustic wave using an electrode structure of the surface-acoustic-wave filter. The method also includes propagating the acoustic wave across a piezoelectric layer of the surface-acoustic-wave filter. The piezoelectric layer includes lithium niobate (LiNbO$_3$) material having a planar surface. The propagating of the acoustic wave includes propagating the acoustic wave across the planar surface of the lithium niobate material in a direction along a first filter (X) axis. A second filter (Y) axis is along the planar surface and perpendicular to the first filter (X) axis. A third filter (Z) axis is normal to the planar surface. An orientation of the first filter (X) axis, the second filter (Y) axis, and the third filter (Z) axis is relative to a crystalline structure of the lithium niobate plate as defined by Euler angles lambda ($\lambda$), mu ($\mu$), and theta ($\theta$). A value of the Euler angle mu ($\mu$) has a range approximately from 70° to −55°. The method additionally includes converting the propagated acoustic wave into a filtered signal using the electrode structure.

In an example aspect, a piezoelectric apparatus is disclosed. The piezoelectric apparatus includes lithium niobate (LiNbO$_3$) material with a planar surface. The lithium niobate material is configured to enable propagation of an acoustic wave across the planar surface in a direction along a first filter (X) axis. A second filter (Y) axis is along the planar surface and perpendicular to the first filter (X) axis. A third filter (Z) axis is normal to the planar surface. An orientation of the first filter (X) axis, the second filter (Y) axis, and the third filter (Z) axis is relative to a crystalline structure of the lithium niobate material as defined by Euler angles lambda ($\lambda$), mu ($\mu$), and theta ($\theta$). A value of the Euler angle mu ($\mu$) has a range approximately from −70° to −55°.

BRIEF DESCRIPTION OF DRAWINGS

FIG. 4 illustrates an example implementation of a thin-film surface-acoustic-wave filter using lithium niobate.

FIG. 6 is a flow diagram illustrating an example process performed by a thin-film surface-acoustic-wave filter with lithium niobate.

FIGS. 7-1 and 7-2 depict graphs that illustrate various example performance characteristics of some described thin-film surface-acoustic-wave filters using lithium niobate.

DETAILED DESCRIPTION

Figure 1:
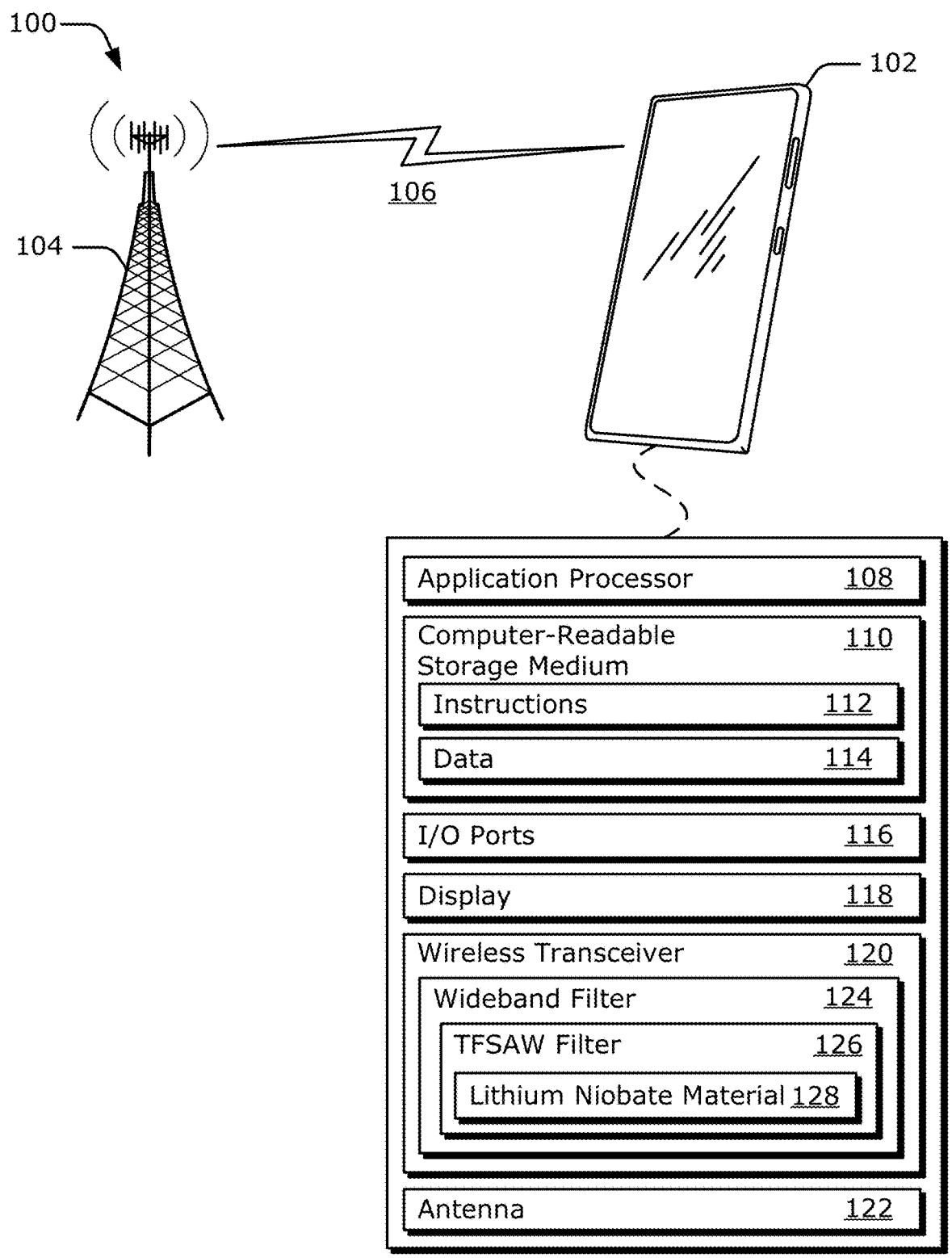
FIG. 1 illustrates an example operating environment for a thin-film surface-acoustic-wave filter using lithium niobate.

To transmit or receive radio-frequency signals within a given frequency band, an electronic device may use filters to pass signals within the frequency band and to suppress (e.g., attenuate) other jammers or noise having frequencies outside of the frequency band. As the number of available frequency bands increases and as the desired passbands of filters widen, it can be challenging to design a filter that can support wide bandwidths without increasing losses within the passband.

Electroacoustic devices (e.g., "acoustic filters") can be used to filter high-frequency (e.g., generally greater than 100 MHz) signals in many applications. An acoustic filter is tuned to pass certain frequencies (e.g., frequencies within its passband) and attenuate other frequencies (e.g., frequencies that are outside of its passband). Using a piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal.

The acoustic wave propagates across the piezoelectric material at a velocity having a magnitude that is significantly less than that of the propagation velocity of the electrical wave. Generally, the magnitude of the propagation velocity of a wave is proportional to a size of a wavelength of the wave. Consequently, after conversion of the electrical signal wave into the acoustic wave, the wavelength of the acoustic wave is significantly smaller than the wavelength of the electrical signal wave. The resulting smaller wavelength of the acoustic wave enables filtering to be performed using a smaller filter device. This permits acoustic filters to be used in space-constrained devices, including portable electronic devices such as cellular phones.

It can be challenging, however, to design an acoustic filter that can provide filtering for wideband applications. Some filter designs can realize a wide passband at the cost of higher losses within the passband, a higher dependence on temperature, or introducing undesired phase transitions. Still other filter designs cannot achieve a target frequency response (e.g., a desired passband) without introducing other external components.

To address this challenge, techniques for implementing a thin-film surface-acoustic-wave (SAW) (TFSAW) filter using lithium niobate (LiNbO$_3$) is described. In example implementations, the thin-film surface-acoustic-wave filter includes an electrode structure, a substrate layer, and a piezoelectric layer. The piezoelectric layer includes lithium niobate material with a crystal orientation defined by Euler angles lambda ($\lambda$), mu ($\mu$), and theta ($\theta$). In some cases, a value of the Euler angle mu ($\mu$) can be approximately between $-70°$ and $-55°$, or equivalent angles thereof due to crystal symmetry. Values of the Euler angles lambda ($\lambda$) and theta ($\theta$) can each be approximately between $-10°$ and $10°$.

These Euler angle ranges enable the thin-film surface-acoustic-wave filter to support wideband applications while achieving a relatively low target loss, a relatively high electroacoustic coupling factor ($K^2$), a relatively low target temperature coefficient of frequency (TCF), and/or a relatively spurious-free passband. These factors compare favorably to other micro-acoustic filters (e.g., other surface-acoustic-wave filters and bulk-acoustic-wave filters), including those composed of lithium tantalate (LiTaO$_3$) or others composed of lithium niobate with Euler angles outside of these ranges. For example, certain described implementations of the thin-film surface-acoustic-wave filter can realize a relative bandwidth of approximately 10% or more of a main-resonance frequency (e.g., a relative bandwidth approximately equal to 10%, 12%, 20%, 24%, or 26% of the main-resonance frequency). With this bandwidth performance, the thin-film surface-acoustic-wave filter can readily filter signals associated with 5th-generation wireless communications or radar sensing. In a particular example, the thin-film surface-acoustic-wave filter can support communications within the N79 frequency band, which is associated with frequencies approximately between 4.4 and 5 gigahertz (GHz), and/or the N77 frequency band, which is associated with frequencies approximately between 3.3 and 4.2 GHz.

In some filter designs, the bandwidth of the thin-film surface-acoustic-wave filter can be indirectly characterized with respect to a pole-zero distance (pzd) of a resonator or interdigital transducer (IDT) or an electroacoustic coupling factor of the layer stack. The bandwidth can be related to a scalar multiple of the pole-zero distance based on the filter design. In an example implementation, the scalar multiple can be approximately between 1.2 and 2.0. To realize a filter with high bandwidths, the resonator or interdigital transducer of the thin-film surface-acoustic-wave filter can be designed to have a high pole-zero distance, such as a pole-zero distance that is greater than or equal to approximately 10% (e.g., a pole-zero distance approximately equal to 10% or 13%).

Example electroacoustic coupling factors realizable by the thin-film surface-acoustic-wave layer structure can be approximately between 15% and 26%. The electroacoustic coupling factor is dependent on both the Euler angle mu ($\mu$) of the lithium niobate material and the thickness of the lithium niobate material. In an example implementation, the thickness of the lithium niobate material is set to enable the thin-film surface-acoustic-wave filter to realize an electroacoustic coupling factor of approximately 20% or more based on the Euler angle mu ($\mu$) being approximately between $-70°$ and $-55°$. For example, an absolute thickness of the lithium niobate material can be between approximately 100 and 250 nanometers (nm). As another example, a relative thickness of the lithium niobate material can be approximately between 10% and 35% of twice a pitch of the interdigital transducer. The electroacoustic coupling factor is also dependent on the other Euler angles lambda ($\mu$) and theta ($\theta$). Values of the Euler angles lambda ($\mu$) and theta ($\theta$) can each be approximately between $-10°$ and $10°$.

In some cases, the bandwidth of the thin-film surface-acoustic-wave filter is constrained in order to meet other target performance levels, such as a temperature coefficient of frequency. In described implementations, the thin-film surface-acoustic-wave filter can realize an absolute value of the temperature coefficient of frequency of approximately 60 parts-per-million/Kelvin (ppm/K) or less for bandwidths approximately between 10% and 26% of the main-resonance frequency. As an example, the temperature coefficient of frequency can be approximately equal to $-20$ ppm/K, $-40$ ppm/K, or $-60$ ppm/K.

In other cases, a structure with a target electroacoustic coupling factor can introduce spurious modes within a passband of the thin-film surface-acoustic-wave filter. To address this problem, the lithium niobate material and/or the substrate layer can be tailored to suppress the spurious modes. For example, the crystal orientation of the lithium niobate material can be chosen to suppress a spurious Rayleigh mode. In an example implementation, setting the value of the Euler angle mu ($\mu$) approximately between $-55°$ to $-63°$ can provide sufficient attenuation of the Raleigh mode.

Additionally or alternatively, thicknesses of the lithium niobate material and a compensation layer within the substrate layer can be chosen to suppress a spurious plate mode. A support layer within the substrate layer can also have a particular crystal orientation to suppress the spurious plate mode. Tailoring the thicknesses of the lithium niobate material and the compensation layer and/or tailoring the crystal orientation of the support layer can be used to help suppress spurious modes for crystal orientations of the lithium niobate material that are susceptible to spurious modes, such as lithium niobate material with the Euler angle mu ($\mu$) set to −70°. By customizing characteristics of the lithium niobate material or the substrate layer, the thin-film surface-acoustic-wave filter can operate in a target mode (e.g. a desired mode), such as a horizontal-shear-wave mode, while suppressing other spurious modes, such as the Rayleigh mode and/or the spurious plate modes. In this manner, the thin-film surface-acoustic-wave filter can realize a relatively high spurious-free bandwidth.

FIG. 1 illustrates an example environment 100 for operating a thin-film surface-acoustic filter using lithium niobate. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, a fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. Alternatively or additionally, the computing device 102 can include a wired transceiver, such as an Ethernet or fiber optic interface for communicating over a local network, intranet, or the Internet. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one wideband filter 124. The wideband filter 124 can have a relative bandwidth of approximately 10% or more of a main-resonance frequency (e.g., a relative bandwidth approximately equal to 10%, 12%, 20%, 24%, or 26% of the main-resonance frequency). In example implementations, the bandwidth can be on the order of approximately 0.5 GHz or more (e.g., approximately 0.7 GHz, or 1 GHz). The wideband filter 124 is implemented using at least one thin-film surface-acoustic-wave filter 126 (TFSAW Filter 126). In some implementations, the wideband filter 124 can include multiple thin-film surface-acoustic-wave filters 126 arranged in series, in parallel, in a ladder structure, in a lattice structure, or some combination thereof. Although performance characteristics of the thin-film surface-acoustic wave filter 126 can be particularly advantageous for implementing the wideband filter 124, the techniques described herein can also be used to implement other types of acoustic filters with narrower bandwidths.

The thin-film surface-acoustic-wave filter 126 includes at least one lithium niobate material 128. The lithium niobate material 128 can alternatively be referred to as a lithium niobate film, a lithium niobate plate, a lithium niobate layer, or a lithium niobate substrate. Lithium niobate is a type of crystal composed of niobium, lithium, and oxygen. The lithium niobate material 128 is composed of this lithium niobate crystal, or a similar type of crystal, such as doped lithium niobate. Other types of mixed crystals that have a similar symmetry as lithium niobate can also be used to form the lithium niobate material 128. The lithium niobate material 128 forms the piezoelectric material for the thin-film surface-acoustic-wave filter 126. The wideband filter 124 is further described with respect to FIG. 2.

Figure 2:
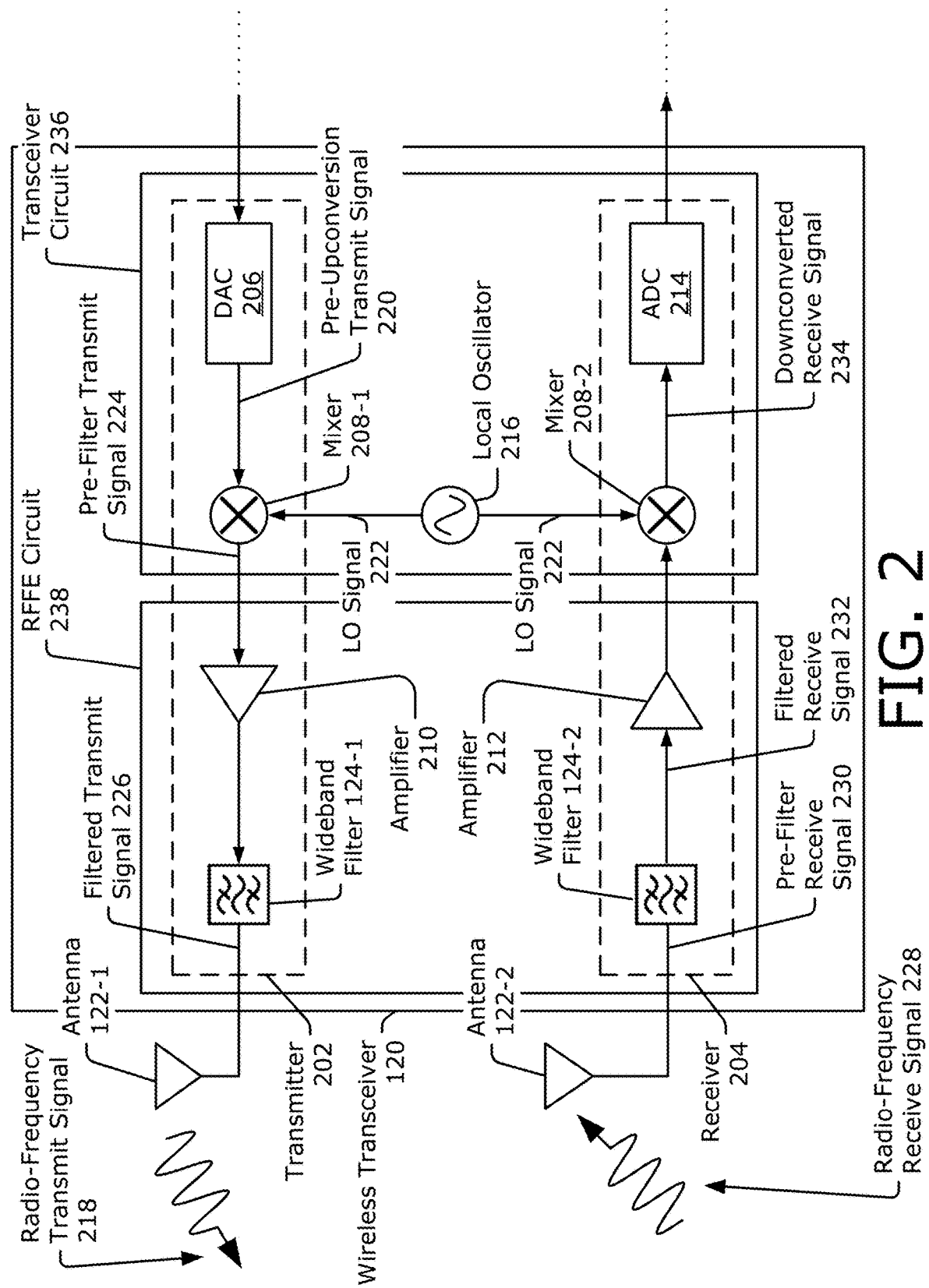
FIG. 2 illustrates an example wireless transceiver including a wideband filter.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be selectively connected to a same antenna through a switch (not shown). The transmitter 202 is shown to include at least one digital-to-analog converter 206 (DAC 206), at least one first mixer 208-1, at least one amplifier 210 (e.g., a power amplifier), and at least one first wideband filter 124-1. The receiver 204 includes at least one second wideband filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits, such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the wideband filter 124-1 of the transmitter 202, the wideband filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some spurious (e.g., unwanted) frequencies, such as a harmonic frequency. The amplifier 210 amplifiers the pre-filter transmit signal 224 and passes the amplified pre-filter transmit signal 224 to the wideband filter 124-1. The first wideband filter 124-1 filters the amplified pre-filter transmit signal 224 to generate a filtered transmit signal 226. As part of the filtering process, the first wideband filter 124-1 attenuates the one or more spurious frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second wideband filter 124-2 accepts the received radio-frequency receive signal 228, which is represented by a pre-filter receive signal 230. The second wideband filter 124-2 filters any spurious frequencies within the pre-filter receive signal 230 to generate a filtered receive signal 232. Example spurious frequencies can include jammers or noise from the external environment. The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem). The wideband filters 124-1 and 124-2 can be implemented by one or more thin-film surface-acoustic-wave filters 126, an example of which is further described with respect to FIG. 3.

Figure 3:
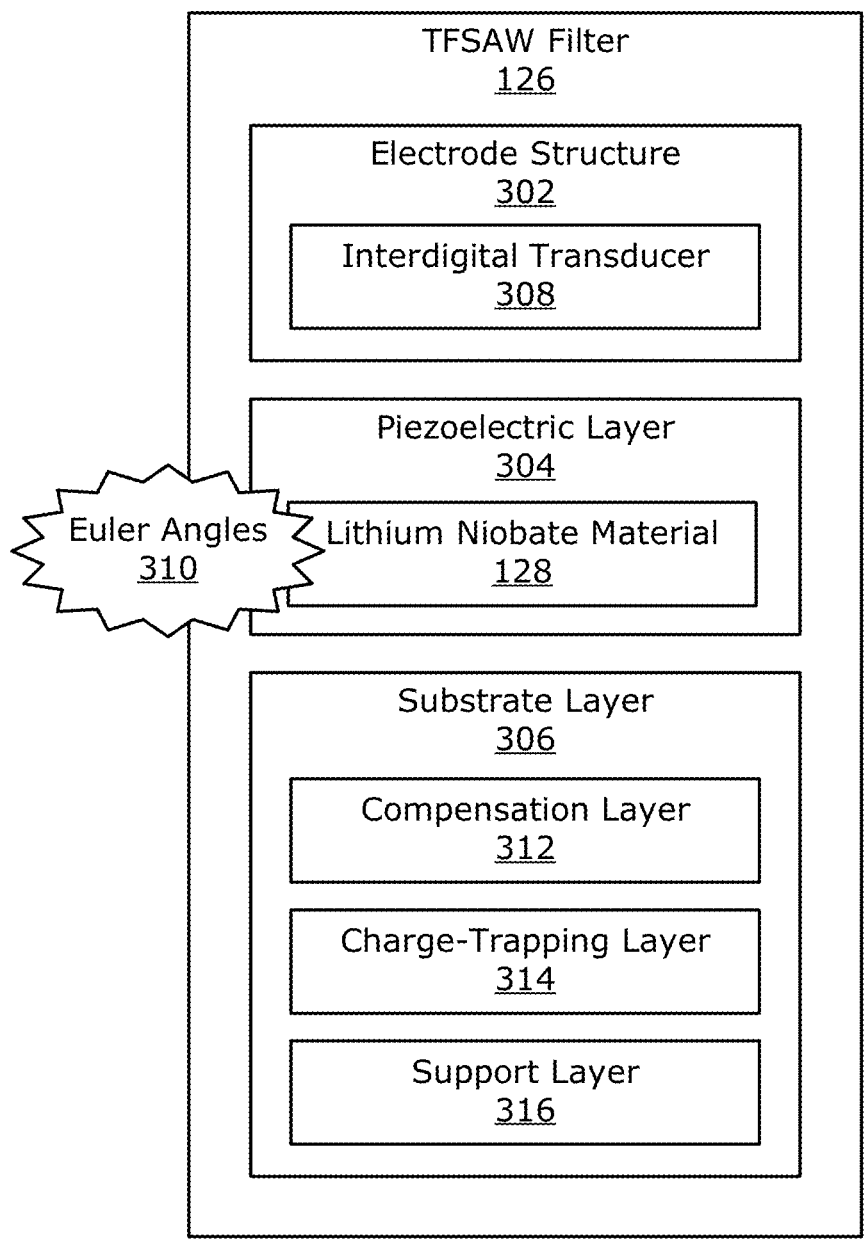
FIG. 3 illustrates example components of a thin-film surface-acoustic-wave filter.

FIG. 3 illustrates example components of the thin-film surface-acoustic-wave filter 126. In the depicted configuration, the thin-film surface-acoustic-wave filter 126 includes at least one electrode structure 302, at least one piezoelectric layer 304 (e.g., piezoelectric material), and at least one substrate layer 306. The electrode structure 302 comprises a conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), or some combination or doped version thereof. The adhesion layers can be composed of chromium (Cr), titanium (Ti), molybdenum (Mo), or some combination thereof.

The electrode structure 302 can include one or more interdigital transducers 308. The interdigital transducer 308 converts an electrical signal into an acoustic wave and converts the acoustic wave into a filtered electrical signal. An example interdigital transducer 308 is further described with respect to FIG. 4. Although not explicitly shown, the electrode structure 302 can also include two or more reflectors. In an example implementation, the interdigital transducer 308 is arranged between two reflectors, which reflect the acoustic wave back towards the interdigital transducer 308.

The material of the piezoelectric layer 304 and the orientation of the propagation surface with respect to the crystal structure of the material affects several performance parameters. Example performance parameters include an electroacoustic coupling factor ($K^2$), a temperature coefficient of frequency (TCF), a mode or type of acoustic wave produced, and/or a velocity of the acoustic wave. The electroacoustic coupling factor characterizes an efficiency of the thin-film surface-acoustic-wave filter 126 in converting between electrical energy and mechanical energy. A filter with a higher electroacoustic coupling factor experiences less insertion loss over a wider frequency range and improved impedance matching than another filter with a lower electroacoustic coupling factor. The temperature coefficient of frequency characterizes an amount a resonant frequency or filter skirt of the filter changes in response to a change in temperature. A filter with a smaller absolute value of the temperature coefficient of frequency has a more stable frequency response over a range of temperatures compared to another filter with a larger absolute value of the temperature coefficient of frequency.

Figure 5:
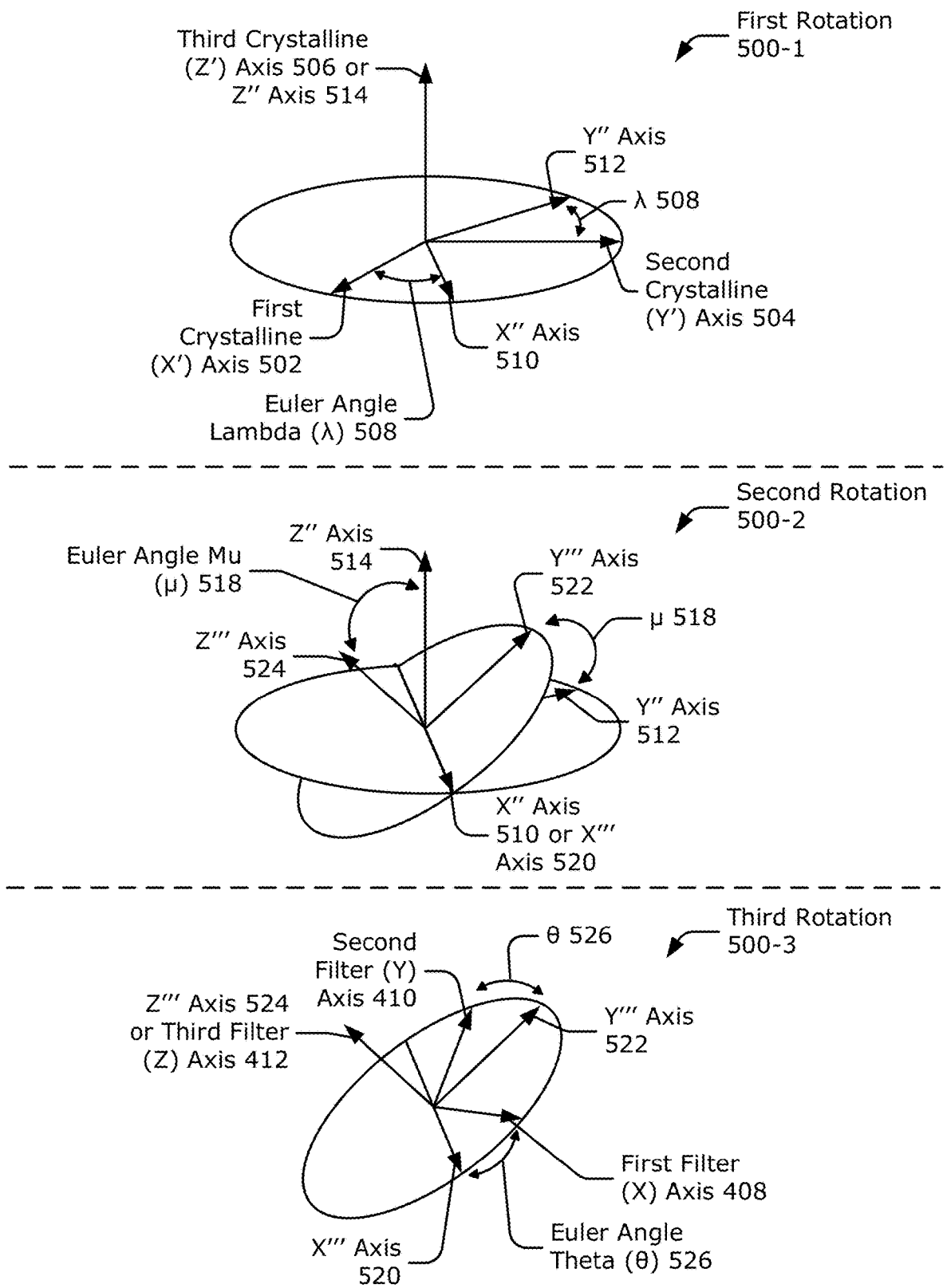
FIG. 5 illustrates example Euler angles that define an orientation of lithium niobate material of a thin-film surface-acoustic-wave filter.

To achieve a target performance level, the piezoelectric layer 304 is implemented using the lithium niobate material 128 having particular Euler angles 310, which are further described with respect to FIG. 5. The Euler angles 310 of the lithium niobate material 128 can be tailored to provide mode suppression (e.g., suppress a Rayleigh mode). Additionally or alternatively, a thickness of the lithium niobate material 128 can be tailored to also provide mode suppression (e.g., suppress a spurious plate mode). The thickness of the lithium niobate material 128 can also be tailored to achieve a target electroacoustic coupling factor and a target temperature coefficient of frequency.

The substrate layer 306 includes one or more sublayers that can support passivation, temperature compensation, power handling, mode suppression, and so forth. As an example, the substrate layer 306 can include at least one compensation layer 312, at least one charge-trapping layer 314, at least one support layer 316, or some combination thereof. These sublayers can be considered part of the substrate layer 306 or their own separate layers.

The compensation layer 312 can provide temperature compensation to enable the thin-film surface-acoustic-filter 126 to achieve the target temperature coefficient of frequency based on the thickness of the lithium niobate material 128. In some implementations, a thickness of the compensation layer 312 can be tailored to provide mode suppression (e.g., suppress the spurious plate mode). In example implementations, the compensation layer 312 can be implemented using at least one silicon dioxide ($SiO_2$) layer. In some applications, the substrate layer 306 may not include, for instance, the compensation layer 312 to reduce cost of the thin-film surface-acoustic-wave filter 126.

The charge-trapping layer 314 can suppress nonlinear substrate effects. The charge-trapping layer 314 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminium nitride (AlN) layer, or some combination thereof.

The support layer 316 can enable the acoustic wave to form across the surface of the piezoelectric layer 304 and reduce the amount of energy that leaks into the substrate layer 306. In some implementations, the support layer 316 can also act as a compensation layer 312. In general, the support layer 316 is composed of material that is non-conducting and provides isolation. For example, the support layer 316 can include at least one silicon (Si) layer (e.g., a doped high-resistive silicon layer), at least one sapphire layer, at least one silicon carbide (SiC) layer, at least one fused silica layer, at least one glass layer, at least one diamond layer, or some combination thereof. In some implementations, the support layer 316 has a relatively similar thermal expansion coefficient (TEC) as the piezoelectric layer 304. The support layer 316 can have a particular crystal orientation to support the suppression or attenuation of spurious modes, as further described with respect to FIG. 5. A structure of the thin-film surface-acoustic-wave filter 126 is further described with respect to FIG. 4.

FIG. 4 illustrates an example implementation of the thin-film surface-acoustic-wave filter 126 using lithium niobate. A three-dimensional perspective view 400 of the thin-film surface-acoustic-wave filter 126 is shown at the top of FIG. 4, and a two-dimensional cross-section view 402 of the thin-film surface-acoustic-wave filter 126 is shown at the bottom of FIG. 4.

In the depicted configuration shown in the two-dimensional cross-section view 402, the piezoelectric layer 304 is disposed between the electrode structure 302 and the substrate layer 306. The substrate layer 306 includes the compensation layer 312, the charge-trapping layer 314, and the support layer 316. The compensation layer 312 is disposed between the piezoelectric layer 304 and the charge-trapping layer 314. The charge-trapping layer 314 is disposed between the compensation layer 312 and the support layer 316. The electrode structure 302 includes the interdigital transducer 308. Although not explicitly shown in FIG. 4, the electrode structure 302 can also include one or more other interdigital transducers 308 and two or more reflectors.

In the three-dimensional perspective view 400, the interdigital transducer 308 is shown to have two comb-shaped electrode structures with fingers extending from two busbars (e.g., conductive segments or rails) towards each other. The electrode fingers are arranged in an interlocking manner in between the two busbars of the interdigital transducer 308 (e.g., arranged in an interdigitated manner). In other words, the fingers connected to a first busbar extend towards a second busbar but do not connect to the second busbar. As such, there is a gap between the ends of these fingers and the second busbar. Likewise, fingers connected to the second busbar extend towards the first busbar but do not connect to the first busbar. There is therefore a gap between the ends of these fingers and the first busbar.

In the direction along the busbars, there is an overlap region including a central region 404 where a portion of one finger overlaps with a portion of an adjacent finger. This central region 404, including the overlap, may be referred to as the aperture, track, or active region where electric fields are produced between fingers to cause an acoustic wave 414 to form at least in this region of the piezoelectric layer 304.

A physical periodicity of the fingers is referred to as a pitch 406 of the interdigital transducer 308. The pitch 406 may be indicated in various ways. For example, in certain aspects, the pitch 406 may correspond to a magnitude of a distance between consecutive fingers of the interdigital transducer 308 in the central region 404. This distance may be defined, for example, as the distance between center points of each of the fingers. The distance may be generally measured between a right (or left) edge of one finger and the right (or left) edge of an adjacent finger when the fingers have uniform widths. In certain aspects, an average of distances between adjacent fingers of the interdigital transducer 308 may be used for the pitch 406.

The frequency at which the piezoelectric layer 304 vibrates is a main-resonance frequency of the electrode structure 302. The frequency is determined at least in part by the pitch 406 of the interdigital transducer 308 and other properties of the thin-film surface-acoustic-filter 126. As an example, the pitch 406 can be approximately between 0.30 and 0.45 micrometers (μm) to enable the thin-film surface-acoustic-wave filter 126 to have a main-resonance frequency of approximately 5 GHz. Other pitches 406 are also possible to realize other main-resonance frequencies. Other example pitches 406 can be approximately between 0.3 and 3.0 μm.

In one aspect, a thickness of the electrode structure 302 can be characterized by the pitch 406. For example, a ratio of the thickness of the electrode structure 302 to twice the pitch 406 can be approximately 0.12 or more. Similarly, a thickness of the piezoelectric layer 304 can also be characterized by the pitch 406 of the electrode structure 302. For example, a ratio of the thickness of the lithium niobate material 128 to twice the pitch 406 can be approximately between 0.12 and 0.32 (e.g., approximately equal to 0.12, 0.25, or 0.32). Likewise, a thickness of the compensation layer 312 can be characterized by the pitch 406 of the electrode structure 302. An example ratio of the thickness of the compensation layer 312 to twice the pitch 406 can be approximately between 0.12 and 0.32 (e.g., approximately equal to 0.12, 0.25, or 0.32). In an example implementation, a ratio of the thickness of the lithium niobate material 128 to twice the pitch 406 is equal to a ratio of the thickness of the compensation layer 312 to twice the pitch 406. In another example implementation, the lithium niobate material 128 is half as thick as the compensation layer 312.

In general, the substrate layer 306 may be substantially thicker than the piezoelectric layer 304 (e.g., potentially on the order of 50 to 3500 times thicker or more). Individual thickness of the electrode structure 302, the piezoelectric layer 304, the compensation layer 312, the charge-trapping layer 314, and the support layer 316 can be on the order of hundreds of micrometers. For example, a relative thickness of the electrode structure 302 can be approximately between 11% and 15% of twice the pitch 406 of the interdigital transducer 308. A relative thickness of the piezoelectric layer 304 can be approximately between 12% and 32% of twice the pitch 406 of the interdigital transducer 308. A relative thickness of the compensation layer 312 can be approximately between 12% to 32% of twice the pitch 406 of the interdigital transducer 308. A relative thickness of the charge-trapping layer 314 can be approximately between 25% and 100% of twice the pitch 406 of the interdigital transducer 308.

In an example implementation, a relative thickness of the piezoelectric layer 304 is approximately between 15% and 18% of twice the pitch 406 of the interdigital transducer 308 and a relative thickness of the compensation layer 312 is approximately between 30% and 37% of twice the pitch 406 of the interdigital transducer 308. In another example implementation, an absolute thickness of the electrode structure 302 is approximately 100 nm, an absolute thickness of the piezoelectric layer 304 is approximately 200 nm, an absolute thickness of the compensation layer 312 is approximately 200 nm, an absolute thickness of the charge-trapping layer 314 is approximately 500 nm, and an absolute thickness of the support layer 316 is approximately 100 μm or more. The absolute thickness of the electrode structure 302 can be approximately between 50 and 140 nm. Also, the absolute thickness of the piezoelectric layer 304 can be approximately between 150 and 500 nm.

It should be appreciated that while a certain number of fingers are illustrated in FIG. 4, the number of actual fingers and lengths and width of the fingers and busbars may be different in an actual implementation. Such parameters depend on the particular application and desired filter characteristics. In addition, the thin-film surface-acoustic-wave filter 126 can include multiple interconnected electrode structures each including multiple interdigital transducers 308 to achieve a desired passband (e.g., multiple interconnected resonators or interdigital transducers 308 in series or parallel connections to form a desired filter transfer function).

Although not shown, each reflector within the electrode structure 302 can have two busbars and a grating structure of conductive fingers that each connect to both busbars. In some implementations, the pitch of the reflector can be similar to or the same as the pitch 406 of the interdigital transducer 308 to reflect the acoustic wave 414 in the resonant frequency range.

In the three-dimensional perspective view 400, the thin-film surface-acoustic-wave filter 126 is defined by a first filter (X) axis 408, a second filter (Y) axis 410, and a third filter (Z) axis 412. The first filter axis 408 and the second filter axis 410 are parallel to a planar surface of the piezoelectric layer 304, and the second filter axis 410 is perpendicular to the first filter axis 408. The third filter axis 412 is normal (e.g., perpendicular) to the planar surface of the piezoelectric layer 304. The busbars of the interdigital transducer 308 are oriented to be parallel to the first filter axis 408. The fingers of the interdigital transducer 308 are orientated to be parallel to the second filter axis 410. Also, an orientation of the piezoelectric layer 304 causes an acoustic wave 414 to mainly form in a direction of the first filter axis 408. As such, the acoustic wave 414 forms in a direction that is substantially perpendicular to the direction of the fingers of the interdigital transducer 308.

The acoustic wave 414 can be, for example, a shear horizontally-polarized wave. The shear horizontally-polarized wave can enable the thin-film surface-acoustic-wave filter 126 to realize a high electroacoustic coupling and reduce a size of the thin-film surface-acoustic-wave filter 126 due to a high velocity of the shear horizontally-polarized wave.

During operation, the thin-film surface-acoustic-filter 126 accepts a radio-frequency signal, such as the pre-filter transmit signal 224 or the pre-filter receive signal 230 shown in FIG. 2. The electrode structure 302 excites an acoustic wave 414 on the piezoelectric layer 304 using the inverse piezoelectric effect. For example, the interdigital transducer 308 in the electrode structure 302 generates an alternating electric field based on the accepted radio-frequency signal. The piezoelectric layer 304 enables the acoustic wave 414 to be formed in response to the alternating electric field generated by the interdigital transducer 308. In other words, the piezoelectric layer 304 causes, at least partially, the acoustic wave 414 to form responsive to electrical stimulation by one or more interdigital transducers 308.

The acoustic wave 414 propagates across the piezoelectric layer 304 and interacts with the interdigital transducer 308 or another interdigital transducer within the electrode structure 302 (not shown in FIG. 4). The acoustic wave 414 that propagates can be a standing wave. In some implementations, two reflectors within the electrode structure 302 cause the acoustic wave 414 to be formed as a standing wave across a portion of the piezoelectric layer 304. In other implementations, the acoustic wave 414 propagates across the piezoelectric layer 304 from the interdigital transducer 308 to another interdigital transducer.

Using the piezoelectric effect, the electrode structure 302 generates a filtered radio-frequency signal based on the propagated surface acoustic wave 414. In particular, the piezoelectric layer 304 generates an alternating electric field due to the mechanical stress generated by the propagation of the acoustic wave 414. The alternating electric field induces an alternating current in the other interdigital transducer or the interdigital transducer 308. This alternating current forms the filtered radio-frequency signal, which is provided at an output of the thin-film surface-acoustic-filter 126. The filtered radio-frequency signal can include the filtered transmit signal 226 or the filtered receive signal 232 of FIG. 2.

FIG. 5 illustrates example Euler angles 310 (of FIG. 3) that define an orientation of the lithium niobate material 128 of the thin-film surface-acoustic-wave filter 126 relative to the crystalline structure of the lithium niobate material. A first crystalline (X') axis 502, a second crystalline (Y') axis 504, and a third crystalline (Z') axis 506 are fixed along crystallographic axes of a lithium niobate crystal, which is used to form the lithium niobate material 128. A first rotation 500-1 is applied to rotate the first crystalline X' axis 502 and the second crystalline Y' axis 504 about the third crystalline Z' axis 506. In particular, the first rotation 500-1 rotates the first crystalline X' axis 502 in a direction of the second crystalline Y' axis 504. The angle associated with the first rotation 500-1 characterizes one of the Euler angles 310, which is represented by Euler angle lambda (λ) 508. The resulting rotated axes are represented by a new set of axes: an X" axis 510, a Y" axis 512, and a Z" axis 514. As shown in FIG. 5, the third crystalline Z' axis 506 remains unchanged by the first rotation 500-1 such that the third crystalline Z' axis 506 is equal to the Z" axis 514.

In a second rotation 500-2, the Y" axis 512 and the Z" axis 514 are rotated about the X" axis 510 by another Euler angle 310, which is represented by Euler angle mu (μ) 518. In this case, the Y" axis 512 is rotated in the direction of the Z" axis 514. The resulting rotated axes are represented by a new set of axes: an X'" axis 520, a Y'" axis 522, and a Z'" axis 524. As shown in FIG. 5, the X" axis 510 remains unchanged by the second rotation 500-2 such that the X" axis 510 is equal to the X'" axis 520.

In a third rotation 500-3, the X'" axis 520 and the Y'" 522 axis are rotated about the Z'" axis 524 by an additional Euler angle 310, which is represented by Euler angle theta (θ) 526. In this case, the X'" axis 520 is rotated in the direction of the Y'" axis 522. The resulting rotated axes are represented by the filter axes of FIG. 4 (e.g., the first filter X axis 408, the second filter Y axis 410, and the third filter Z axis 412). As shown in FIG. 5, the Z'" axis 524 remains unchanged by the third rotation 500-3 such that the Z'" axis 524 is equal to the third filter Z axis 412. The X axis 408 specifies the direction of formation of the acoustic wave 414 of FIG. 4.

An orientation of the first filter X axis 408, the second filter Y axis 410, and the third filter Z axis 412 relative to a crystalline structure of the lithium niobate material 128 is defined by the Euler angles lambda (λ) 508, mu (μ) 518, and theta (θ) 526. In particular, the lithium niobate material 128 can be cut such that a value of the Euler angle mu (μ) 518 is approximately between −70° and −55°. In example implementations, the Euler angle mu (μ) 518 can be approximately −70°, −63°, or −55°. Alternatively, the lithium niobate material 128 can have an equivalent crystal orientation due to crystal symmetry. In these examples, a symmetrically equivalent crystal orientation results in an Euler angle mu (μ) 518 that is approximately between 110° and 125° due to crystal symmetry. The crystal symmetry enables the lithium niobate material 128 to have similar properties between two angles of mu (μ) 518, which are separated by 180° by, for instance, flipping the material over on the substrate layer 306. A value of the Euler angles lambda (μ) 508 and theta (θ) 526 can each be approximately between −10° and +10°, approximately between −5° and +5°, or approximately equal to 0°.

In general, a variation in any of the Euler angles 310 can be less than or equal to +/−1.5°. Sometimes the variation in any of the Euler angles 310 is less than or equal to +/−0.2°. Therefore, the term approximately can mean that any of the Euler angles can be within +/−1.5° of a specified value or less (e.g., within +/−0.2° of a specified value).

In FIG. 4, an orientation of the first filter X axis 408, the second filter Y axis 410, and the third filter Z axis 412 relative to a silicon layer, which may be used to implement the support layer 316, can similarly be defined by other Euler angles lambda (λ) 508, mu (μ) 518, and theta (θ) 526. In an example implementation, a value of the Euler angle theta (θ) relative to the crystalline structure of silicon can be approximately between 45° and 90°. In an example implementation, a crystal orientation of the support layer 316 has lambda (λ) 508 approximately equal to 0°, mu (μ) 518 approximately equal to 0°, and theta (θ) 526 approximately equal to 45°. In terms of Miller indices, this example support layer 316 can be represented as Si (1 0 0) flat [0 1 1]. In another example implementation, a crystal orientation of the support layer 316 has lambda (λ) 508 approximately equal to −45°, mu (μ) 518 approximately equal to −55°, and theta (θ) 526 approximately equal to 60°. In terms of Miller indices, this example support layer 316 can be represented as Si (1 1 1) flat [0 −1 1]. In yet another example implementation, a crystal orientation of the support layer 316 has lambda (λ) 508 approximately equal to −45°, mu (μ) 518 approximately equal to −55°, and theta (θ) 526 approximately equal to 90°. In terms of Miller indices, this example support layer 316 can be represented as Si (1 1 1) flat [1 1 2]. Suitable choice of these crystal orientations enable the support layer 316 to suppress spurious modes, including those associated with Rayleigh waves.

FIG. 6 is a flow diagram illustrating an example process 600 performed by a thin-film surface-acoustic-wave filter 126. The process 600 is described in the form of a set of blocks 602-608 that specify operations that can be performed. However, operations are not necessarily limited to the order shown in FIG. 6 or described herein, for the operations may be implemented in alternative orders or in fully or partially overlapping manners. Also, more, fewer, and/or different operations may be implemented to perform the process 600, or an alternative process. Operations represented by the illustrated blocks of the process 600 may be performed by a wideband filter (e.g., of FIG. 1 or 2) or a thin-film surface-acoustic-wave filter 126 (e.g., of FIG. 1, 3, or 4). More specifically, the operations of the process 600 may be performed, at least in part, by a piezoelectric layer 304 including the lithium niobate material 128, as shown in FIGS. 3 and 4.

At block 602, a radio-frequency signal is converted into an acoustic wave using an electrode structure of a surface-acoustic-wave filter. For example, the electrode structure 302 of the thin-film surface-acoustic-wave filter 126 converts the radio-frequency signal (e.g., the pre-filter transmit signal 224 or the pre-filter receive signal 230 of FIG. 2) into the acoustic wave 414 of FIG. 4. In particular, an alternating current associated with the radio-frequency signal causes the interdigital transducer 308 to generate an electric field, which excites an acoustic wave 414 on the piezoelectric layer 304 due to the inverse piezoelectric effect.

At block 604, the acoustic wave propagates across a piezoelectric layer of the surface-acoustic-wave filter. The piezoelectric layer comprises lithium niobate material having a planar surface. For example, the acoustic wave 414 propagates across the piezoelectric layer 304 of the thin-film surface-acoustic-wave filter 126, as shown in FIG. 4. In some implementations, the propagation of the acoustic wave 414 can result in the formation of an effective standing wave across at least a portion of the piezoelectric layer 304. The piezoelectric layer 304 includes the lithium niobate material 128, as shown in FIG. 3. The lithium niobate material 128 has a planar surface.

At block 606, the acoustic wave propagates across the planar surface of the lithium niobate material in a direction along a first filter (X) axis. For example, the acoustic wave 414 propagates across the planar surface of the lithium niobate material 128 in the direction along the first filter (X) axis 408, as shown in FIG. 4. A second filter (Y) axis 410 is along the planar surface and perpendicular to the first filter (X) axis 408. A third filter (Z) axis 412 is normal to the planar surface. An orientation of the first filter (X) axis 408, the second filter (Y) axis 410, and the third filter (Z) axis 412 is relative to a crystalline structure of the lithium niobate material 128 as defined by Euler angles lambda ($\lambda$) 508, mu ($\mu$) 518, and theta ($\theta$) 526 of FIG. 5. A value of the Euler angle mu ($\mu$) 518 has a range approximately from $-70°$ to $-55°$, or equivalent angles thereof due to crystal symmetry.

At block 608, the propagated acoustic wave is converted into a filtered signal using the electrode structure. For example, the electrode structure 302 converts the acoustic wave 414 into a filtered signal (e.g., the filtered transmit signal 226 or the filtered receive signal 232 of FIG. 2). Due to the piezoelectric effect, the piezoelectric layer 304 generates an electric field based on the formed acoustic wave 414. This electric field induces an alternating current in the interdigital transducer 308 of the electrode structure 302 or another interdigital transducer 308 of the electrode structure 302. This alternating current forms the filtered signal.

Figure 7:
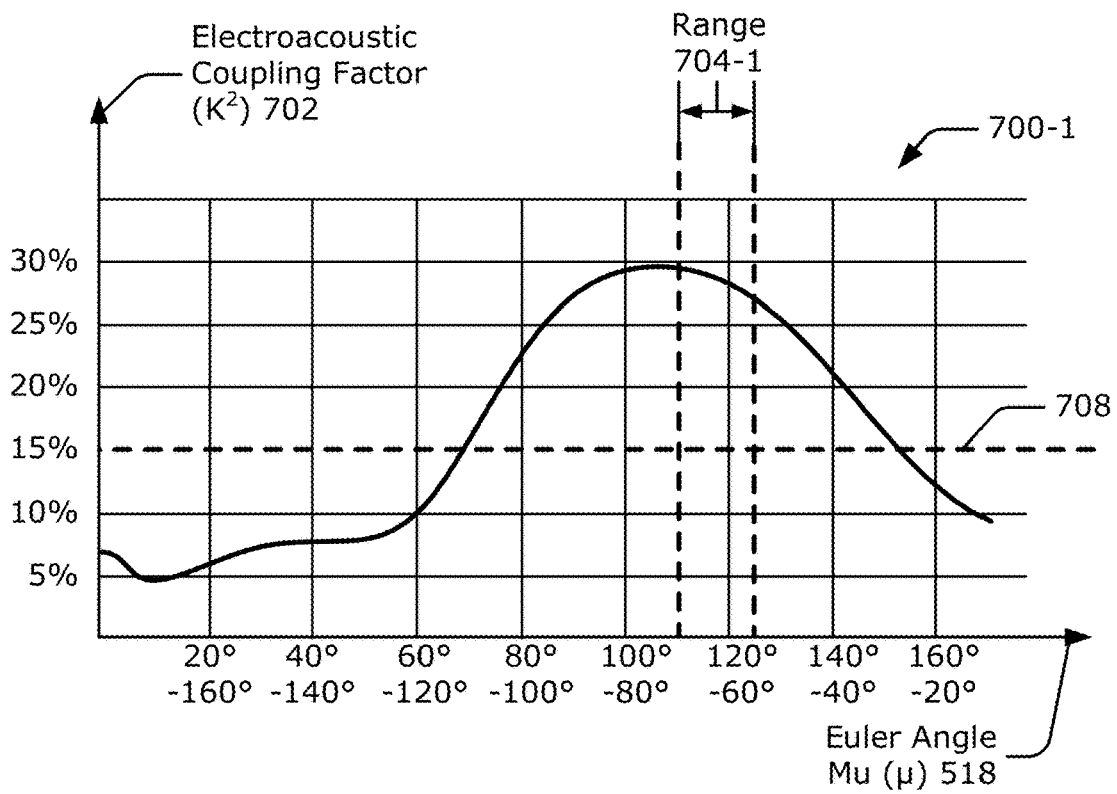
Figure 1:
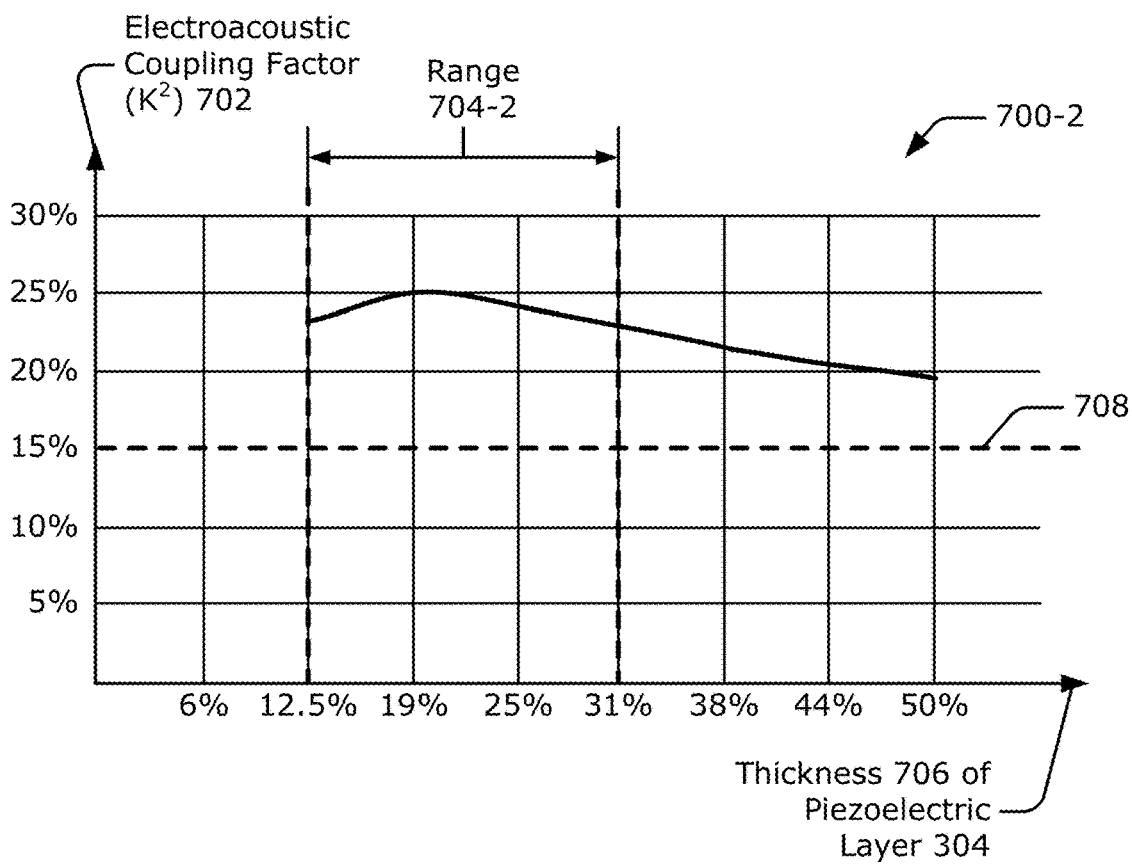
Figures 2, 7:
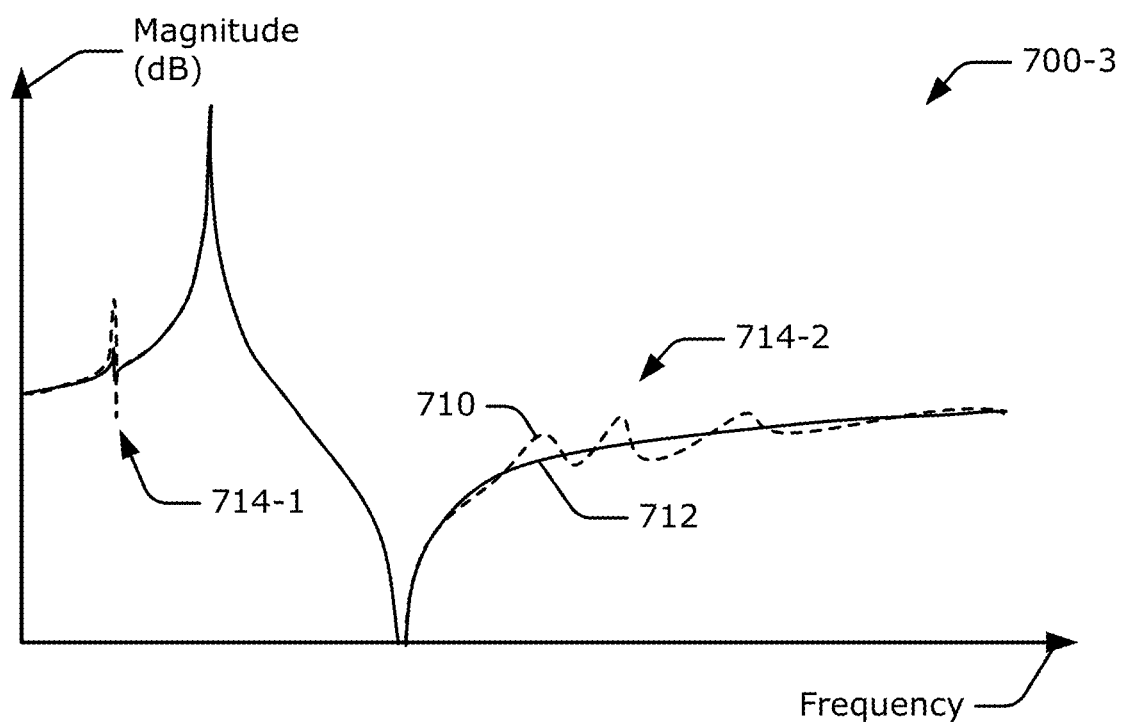

FIGS. 7-1 and 7-2 depict example graphs 700-1, 700-2, and 700-3, which illustrate various example performance characteristics of some described thin-film surface-acoustic-wave filters 126 using lithium niobate. A first graph 700-1 describes a relationship between the Euler angle mu ($\mu$) 518 of the piezoelectric layer 304 and an electroacoustic coupling factor 702 of the layer stack for a particular thickness 706 of the piezoelectric layer 304. As shown in the graph 700-1, different values of Euler angle mu ($\mu$) 518 result in the electroacoustic coupling factor 702 being greater than, less than, or equal to a threshold 708, which is approximately equal to 15% in this example. The horizontal axis in the graph 700-1 shows symmetrically equivalent angles of the Euler angle mu ($\mu$) 518.

A second graph 700-2 describes a relationship between a thickness 706 of the piezoelectric layer 304 and the electroacoustic coupling factor 702 for a particular value of the Euler angle mu ($\mu$) 518. In this example, a range of thicknesses 706 of the piezoelectric layer 304 enable the electroacoustic coupling factor 702 to be greater than the threshold 708. The horizontal axis in the graph 700-2 shows example relative thicknesses 706 of the piezoelectric layer 304 as a percentage of twice the pitch 406. In this example, the pitch 406 is approximately equal to 0.4 micrometers.

In general, the value of the Euler angle mu ($\mu$) 518 and the thickness 706 of the piezoelectric layer 304 are optimized to enable the thin-film surface-acoustic-wave filter 126 to realize an electroacoustic coupling factor 702 that is greater than or equal to the threshold 708. For example, the value of the Euler angle mu ($\mu$) 518 can be approximately between $-70°$ and $-55°$, as shown by range 704-1, and the thickness 706 of the piezoelectric layer 304 can be approximately between 12.5% and 31% of twice a pitch 406 of an interdigital transducer, as shown by range 704-2. These values enable the thin-film surface-acoustic-wave filter 126 to realize an electroacoustic coupling factor 702 that is greater than or equal to 15%. In some cases, the realized electroacoustic coupling factor 702 can be approximately greater than or equal to 20% (e.g., approximately equal to 25%).

Some combinations of values of the Euler angle mu ($\mu$) 518 and thicknesses 706 of the piezoelectric layer 304 can attenuate spurious modes within a bandwidth of the thin-film surface-acoustic-wave filter 126. For example, the Euler angle mu ($\mu$) 518 can be approximately equal to $-55°$ and a relative thickness 706 of the piezoelectric layer 304 can be approximately between 23% and 30% of twice the pitch 406 of the interdigital transducer 308 to attenuate spurious modes within the bandwidth of the thin-film surface-acoustic-wave filter 126. Other combinations of values of the Euler angle mu ($\mu$) 518 and thicknesses 706 of the piezoelectric layer 304 can introduce spurious modes within a bandwidth of the thin-film surface-acoustic-wave filter 126, as further described with respect to FIG. 7-2.

In FIG. 7-2, a third graph 700-3 depicts a first frequency response 710 for a first implementation of the thin-film surface-acoustic-wave filter 126 and a second frequency response for a second implementation of the thin-film surface-acoustic-wave filter 126. In this example, the piezoelectric layers 304 of the first implementation and the second implementation have a same value of the Euler angle mu ($\mu$) 518 and a same thickness 706. For example, a value of the Euler angle mu ($\mu$) 518 of the piezoelectric layer 304 can be approximately equal to $-63°$ and a thickness 706 of the piezoelectric layer 304 can be approximately between 23% and 30% of twice the pitch 406 of the interdigital transducer 308.

The first implementation and the second implementation have support layers 316 with different crystal orientations. For example, the support layer 316 of the first implementation has a crystal orientation with Euler angle theta ($\theta$) 526 approximately equal to 0°. In contrast, the support layer 316 of the second implementation has a different crystal orientation with Euler angle theta ($\theta$) 526 approximately between 45° and 90°.

In the first frequency response 710, spurious modes are observed at 714-1 and 714-2. In the second frequency response 712, the spurious modes are attenuated due to the crystal orientation of the support layer 316. In some comparisons, the attenuation can be on the order of several decibels (dB) (e.g., approximately 2 dB, 4 dB, or 6 dB). In general, the Euler angle mu ($\mu$) 518, the thickness 706 of the piezoelectric layer 304, and/or a crystal orientation of the support layer 316 can be optimized to substantially attenuate spurious modes, such as the Rayleigh mode.

In general, design elements of the thin-film surface-acoustic-wave filter 126 are tuned to achieve desired performance characteristics. These design elements can include the crystal orientation of the piezoelectric layer 304, the thickness 706 of the piezoelectric layer 304, and the crystal orientation and material of the support layer 316, which can impact one or more performance characteristics. For example, the crystal orientation of the piezoelectric layer 304 can impact the electroacoustic coupling factor 702 and whether or not a spurious mode is present. The thickness of the piezoelectric layer 304 can impact the electroacoustic coupling factor 702 and the temperature coefficient of frequency. The crystal orientation and material of the support layer 316 can be selected to substantially attenuate spurious modes.

In some cases, the performance characteristics are further tuned with respect to each other. For example, the electroacoustic coupling factor 702 of the thin-film surface-acoustic-wave filter 126 can be constrained in order to achieve a target temperature coefficient of frequency. In example implementations, the range of values provided for the design elements enable the thin-film surface-acoustic-wave filter 126 to achieve an electroacoustic coupling factor 702 greater than or equal to approximately 15%, an absolute value of the temperature coefficient of frequency of approximately 60 parts-per-million/Kelvin (ppm/K) or less, and/or a relatively spurious-free passband. These values can, however, be tuned in different manners to achieve alternative performance characteristics.

Although described with respect to the thin-film surface-acoustic-wave filter 126, the techniques described herein can also apply to other types of surface-acoustic-wave filters 126. In an example implementation, the wideband filter 124 can be implemented using a surface-acoustic-wave filter that does not include the substrate layer 306 or includes a piezoelectric layer 304 that is thicker than the piezoelectric layer 304 of the thin-film surface-acoustic-wave filter 126.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for filtering, the apparatus comprising:
   at least one surface-acoustic-wave filter comprising:
   an electrode structure;
   a substrate layer comprising at least one support layer, the at least one support layer comprising a silicon (Si) layer; and
   a piezoelectric layer disposed between the electrode structure and the substrate layer, the piezoelectric layer comprising lithium niobate (LiNbO$_3$) material, the lithium niobate material having a planar surface and configured to enable propagation of an acoustic wave across the planar surface in a direction along a first filter (X) axis, wherein:
   a second filter (Y) axis is along the planar surface and perpendicular to the first filter (X) axis;
   a third filter (Z) axis is normal to the planar surface;
   an orientation of the first filter (X) axis, the second filter (Y) axis, and the third filter (Z) axis is relative to a crystalline structure of the lithium niobate material as defined by Euler angles lambda ($\lambda$), mu ($\mu$), and theta ($\theta$);
   a value of the Euler angle mu ($\mu$) has a range approximately from −70° to −55° or at least one symmetrical equivalent;
   an orientation of the first filter (X) axis, the second filter (Y) axis, and the third filter (Z) axis is relative to a crystalline structure of the silicon layer as defined by other Euler angles lambda ($\lambda$), mu ($\mu$), and theta ($\theta$); and
   a value of the other Euler angle theta ($\theta$) relative to the crystalline structure of the silicon layer has a range approximately from 45° to 90°.

2. The apparatus of claim 1, wherein the substrate layer comprises at least one of the following:
   at least one compensation layer; or
   at least one charge-trapping layer.

3. The apparatus of claim 2, wherein:
   the substrate layer comprises the at least one compensation layer;
   the piezoelectric layer is disposed between the electrode structure and the at least one compensation layer; and
   the at least one compensation layer comprises at least one silicon dioxide (SiO$_2$) layer.

4. The apparatus of claim 3, wherein:
   the substrate layer further comprises the at least one charge-trapping layer;
   the at least one compensation layer is disposed between the piezoelectric layer and the at least one charge-trapping layer; and
   the at least one charge-trapping layer comprises at least one of the following:
   a polysilicon (poly-Si) layer;
   an amorphous silicon layer;
   a silicon nitride (SiN) layer;
   a silicon oxynitride (SiON) layer; or
   an aluminium nitride (AlN) layer.

5. The apparatus of claim 4, wherein:
   the at least one charge-trapping layer is disposed between the at least one compensation layer and the at least one support layer; and
   the at least one support layer comprises at least one of the following:
   a sapphire layer;
   a silicon carbide (SiC) layer;
   a glass layer;
   a fused silica layer; or
   a diamond layer.

6. The apparatus of claim 1, wherein:
   a value of the Euler angle lambda ($\lambda$) has a range approximately from −10° to +10°; and
   a value of the Euler angle theta ($\theta$) has a range approximately from −10° to +10°.

7. The apparatus of claim 6, wherein:
   the value of the Euler angle lambda ($\lambda$) is approximately equal to 0°; and
   the value of the Euler angle theta ($\theta$) is approximately equal to 0°.

8. The apparatus of claim 1, wherein the value of the Euler angle mu ($\mu$) further has a range approximately from −68° to −58°.

9. The apparatus of claim 1, wherein:
   the value of the Euler angle mu ($\mu$) is approximately −70°;
   the value of the Euler angle mu ($\mu$) is approximately −63°; or
   the value of the Euler angle mu ($\mu$) is approximately −55°.

10. The apparatus of claim 1, wherein the at least one symmetrical equivalent of the Euler angle mu (μ) has a range of approximately from 110° to 125°.

11. The apparatus of claim 1, wherein:
a value of the other Euler angle lambda (λ) is approximately 0°, a value of the other Euler angle mu (μ) is approximately 0°, and the value of the other Euler angle theta (θ) is approximately 45°.

12. The apparatus of claim 1, wherein:
the lithium niobate material has a thickness;
the electrode structure comprises at least one interdigital transducer having a pitch; and
a ratio of the thickness of the lithium niobate material to twice the pitch of the interdigital transducer has a range approximately from 0.12 to 0.32.

13. The apparatus of claim 1, further comprising:
at least one antenna; and
a wireless transceiver coupled to the at least one antenna, the wireless transceiver comprising the at least one surface-acoustic-wave filter and configured to filter, using the at least one surface-acoustic-wave filter, a wireless signal communicated via the at least one antenna.

14. The apparatus of claim 1, wherein:
a value of the other Euler angle lambda (λ) is approximately −45°, a value of the other Euler angle mu (μ) is approximately −55°, and the value of the other Euler angle theta (θ) is approximately 60°.

15. The apparatus of claim 1, wherein:
a value of the other Euler angle lambda (λ) is approximately −45°, a value of the other Euler angle mu (μ) is approximately −55°, and the value of the other Euler angle theta (θ) is approximately 90°.

16. A method performed by a surface-acoustic-wave filter, the method comprising:
converting a radio-frequency signal into an acoustic wave using an electrode structure of the surface-acoustic-wave filter;
propagating the acoustic wave across a piezoelectric layer of the surface-acoustic-wave filter, the piezoelectric layer comprising lithium niobate (LiNbO$_3$) material having a planar surface, including propagating the acoustic wave across the planar surface of the lithium niobate material in a direction along a first filter (X) axis, the piezoelectric layer disposed between the electrode structure and a substrate layer, wherein:
a second filter (Y) axis is along the planar surface and perpendicular to the first filter (X) axis;
a third filter (Z) axis is normal to the planar surface;
an orientation of the first filter (X) axis, the second filter (Y) axis, and the third filter (Z) axis is relative to a crystalline structure of the lithium niobate material as defined by Euler angles lambda (λ), mu (0, and theta (θ);
a value of the Euler angle mu (μ) has a range approximately from −70° to −55° or at least one symmetrical equivalent;
the substrate layer comprises a silicon (Si) layer;
an orientation of the first filter (X) axis, the second filter (Y) axis, and the third filter (Z) axis is relative to a crystalline structure of the silicon layer as defined by other Euler angles lambda (λ), mu (μ), and theta (θ); and
a value of the other Euler angle theta (θ) relative to the crystalline structure of the silicon layer has a range approximately from 45° to 90°, and
converting the propagated acoustic wave into a filtered signal using the electrode structure.

17. The method of claim 16, wherein the value of the Euler angle mu (μ) further has a range approximately from −68° to −58°.

18. The method of claim 16, wherein:
the value of the Euler angle mu (μ) is approximately −70°;
the value of the Euler angle mu (μ) is approximately −63°; or
the value of the Euler angle mu (μ) is approximately −55°.

19. The method of claim 16, wherein:
a value of the Euler angle lambda (λ) has a range approximately from −10° to +10°; and
a value of the Euler angle theta (θ) has a range approximately from −10° to +10°.

20. The method of claim 16, wherein:
a value of the other Euler angle lambda (λ) is approximately 0°, a value of the other Euler angle mu (μ) is approximately 0°, and the value of the other Euler angle theta (θ) is approximately 45°;
the value of the other Euler angle lambda (λ) is approximately −45°, the value of the other Euler angle mu (μ) is approximately −55°, and the value of the other Euler angle theta (θ) is approximately 60°; or
the value of the other Euler angle lambda (λ) is approximately −45°, the value of the other Euler angle mu (μ) is approximately −55°, and the value of the other Euler angle theta (θ) is approximately 90°.

21. An apparatus comprising:
an electrode structure comprising at least one interdigital transducer having a pitch; and
lithium niobate (LiNbO$_3$) material having a planar surface, the lithium niobate material configured to enable propagation of an acoustic wave across the planar surface in a direction along a first filter (X) axis, wherein:
a second filter axis (Y) is along the planar surface and perpendicular to the first filter (X) axis;
a third filter (Z) axis is normal to the planar surface;
an orientation of the first filter (X) axis, the second filter (Y) axis, and the third filter (Z) axis is relative to a crystalline structure of the lithium niobate material as defined by Euler angles lambda (λ), mu (μ), and theta (θ);
a value of the Euler angle mu (μ) has a range approximately from −70° to −55° or at least one symmetrical equivalent; and
a ratio of a thickness of the lithium niobate material to twice the pitch of the at least one interdigital transducer has a range approximately from 0.12 to 0.32.

22. The apparatus of claim 21, wherein the value of the Euler angle mu (μ) further has a range approximately from −68° to −58°.

23. The apparatus of claim 21, wherein:
the value of the Euler angle mu (μ) is approximately −70°;
the value of the Euler angle mu (μ) is approximately −63°; or
the value of the Euler angle mu (μ) is approximately −55°.

24. The apparatus of claim 21, wherein:
a value of the Euler angle lambda (λ) has a range approximately from −10° to +10°; and
a value of the Euler angle theta (θ) has a range approximately from −10° to +10°.

25. The apparatus of claim 21, further comprising a filter, the filter comprising:
a piezoelectric layer comprising the lithium niobate material; and the at least one interdigital transducer disposed on the piezoelectric layer.

26. The apparatus of claim 21, further comprising:
a substrate layer comprising at least one support layer, the at least one support layer comprising a silicon (Si) layer, wherein:
an orientation of the first filter (X) axis, the second filter (Y) axis, and the third filter (Z) axis is relative to a crystalline structure of the silicon layer as defined by other Euler angles lambda ($\lambda$), mu ($\mu$), and theta ($\theta$); and
a value of the other Euler angle theta ($\theta$) relative to the crystalline structure of the silicon layer has a range approximately from 45° to 90°.

27. An apparatus for filtering, the apparatus comprising:
at least one surface-acoustic-wave filter comprising:
an electrode structure;
a substrate layer comprising:
at least one charge-trapping layer comprising at least one polysilicon (poly-Si) layer; and
at least one compensation layer comprising at least one silicon dioxide ($SiO_2$) layer, the at least one compensation layer disposed between a piezoelectric layer and the at least one charge-trapping layer; and
the piezoelectric layer disposed between the electrode structure and the at least one compensation layer, the piezoelectric layer comprising lithium niobate ($LiNbO_3$) material, the lithium niobate material having a planar surface and configured to enable propagation of an acoustic wave across the planar surface in a direction along a first filter (X) axis, wherein:
a second filter (Y) axis is along the planar surface and perpendicular to the first filter (X) axis;
a third filter (Z) axis is normal to the planar surface;
an orientation of the first filter (X) axis, the second filter (Y) axis, and the third filter (Z) axis is relative to a crystalline structure of the lithium niobate material as defined by Euler angles lambda ($\lambda$), mu ($\mu$), and theta ($\theta$); and
a value of the Euler angle mu ($\mu$) has a range approximately from −70° to −55° or at least one symmetrical equivalent.

28. The apparatus of claim 27, wherein:
the substrate layer comprises at least one support layer;
the at least one support layer comprises a silicon (Si) layer;
an orientation of the first filter (X) axis, the second filter (Y) axis, and the third filter (Z) axis is relative to a crystalline structure of the silicon layer as defined by other Euler angles lambda ($\lambda$), mu ($\mu$), and theta ($\theta$); and
a value of the other Euler angle theta ($\theta$) relative to the crystalline structure of the silicon layer has a range approximately from 45° to 90°.

29. The apparatus of claim 28, wherein:
a value of the other Euler angle lambda ($\lambda$) is approximately 0°, a value of the other Euler angle mu ($\mu$) is approximately 0°, and the value of the other Euler angle theta ($\theta$) is approximately 45°;
the value of the other Euler angle lambda ($\lambda$) is approximately −45°, the value of the other Euler angle mu ($\mu$) is approximately −55°, and the value of the other Euler angle theta ($\theta$) is approximately 60°; or
the value of the other Euler angle lambda ($\lambda$) is approximately −45°, the value of the other Euler angle mu ($\mu$) is approximately −55°, and the value of the other Euler angle theta ($\theta$) is approximately 90°.

30. The apparatus of claim 27, wherein:
the lithium niobate material has a thickness;
the electrode structure comprises at least one interdigital transducer having a pitch; and
a ratio of the thickness of the lithium niobate material to twice the pitch of the interdigital transducer has a range approximately from 0.12 to 0.32.

* * * * *